United States Patent
Krishnan et al.

(10) Patent No.: US 6,492,209 B1
(45) Date of Patent: Dec. 10, 2002

(54) SELECTIVELY THIN SILICON FILM FOR CREATING FULLY AND PARTIALLY DEPLETED SOI ON SAME WAFER

(75) Inventors: Srinath Krishnan, San Jose, CA (US); Matthew Buynoski, Palo Alto, CA (US); Witold Maszara, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 196 days.

(21) Appl. No.: 09/607,629

(22) Filed: Jun. 30, 2000

(51) Int. Cl.[7] .............................................. H01L 21/302
(52) U.S. Cl. ........................ 438/149; 438/479; 438/694; 438/697; 438/719; 438/753; 438/692
(58) Field of Search .............................. 216/33, 39, 20, 216/88, 99, 79; 438/694, 697, 719, 753, 692, 149, 151, 479

(56) References Cited

U.S. PATENT DOCUMENTS

| | | | |
|---|---|---|---|
| 5,145,802 A | 9/1992 | Tyson et al. | |
| 5,670,387 A | 9/1997 | Sun | |
| 5,670,388 A | 9/1997 | Machesney et al. | |
| 5,940,691 A | 8/1999 | Manning | |
| 5,942,781 A | 8/1999 | Burr et al. | |
| 5,949,144 A | * 9/1999 | Delgado et al. | 257/776 |
| 5,963,813 A | 10/1999 | Manning | |
| 5,973,257 A | * 10/1999 | Cantarini et al. | 136/249 |
| 5,985,728 A | 11/1999 | Jennings | |
| 6,255,667 B1 | * 5/2001 | Buynoski et al. | 257/347 |
| 6,326,247 B1 | * 12/2001 | Krishnan et al. | 438/151 |

* cited by examiner

Primary Examiner—George Goudreau
(74) Attorney, Agent, or Firm—Amin & Turocy, LLP

(57) ABSTRACT

A method for providing partially depleted and fully depleted transistor devices on the same semiconductor wafer. At least one trench is etched into a bulk semiconductor wafer. The wafer is then filled with an insulating material and polished down to the surface level of the semiconductor wafer to form a generally planar surface. A handle wafer is provided having a substrate layer and an insulating layer. The planar surface of the semiconductor wafer is bonded to the insulating layer of the handle wafer. The trench filled regions of the semiconductor wafer form regions of a first thickness and the remaining regions of the semiconductor wafer form regions of a second thickness. Fully depleted transistor device can then be formed in the regions of the first thickness and partially depleted transistor devices can be formed in regions of the second thickness.

14 Claims, 7 Drawing Sheets

SELECTIVELY THIN SILICON FILM FOR CREATING FULLY AND PARTIALLY DEPLETED SOI ON SAME WAFER

FIELD OF THE INVENTION

The present invention generally relates to the design of field effect transistors (FETS) and, more particularly, to a method of forming a metal oxide silicon (MOS) transistor structure including both fully depleted and partially depleted devices.

BACKGROUND OF THE INVENTION

As is known in the art, transistors such as metal oxide silicon (MOS) transistors, have been formed in isolated regions of a semiconductor body such as an epitaxial layer which was itself formed on a semiconductor, typically bulk silicon, substrate. With an n-channel MOS field effect transistor (FET), the body is of p-type conductivity and the source and drain regions are formed in the p-type conductivity body as $N^+$ type conductivity regions. With a p-channel MOSFET, the body, or epitaxial layer, is of n-type conductivity and the source and drain regions are formed in the n-type conductivity body as $P^+$ type conductivity regions. It has been suggested that the semiconductor body, or layer, be formed on an insulating substrate, or over an insulation layer formed in a semiconductor substrate. Such technology sometimes is referred to as Silicon-on-Insulator (SOI) technology. Silicon-on-Insulator MOS technologies have a number of advantages over bulk silicon MOS transistors. These advantages include: reduced source/drain capacitance and hence improved speed performance at higher-operating frequencies; reduced $N^+$ to $P^+$ spacing and hence higher packing density due to ease of isolation; and higher "soft error" upset immunity (i.e., the immunity to the effects of alpha particle strikes).

Silicon-on-Insulator technology is characterized by the formation of a thin silicon layer for formation of the active devices over an insulating layer, such as an oxide, which is in turn formed over a substrate. Transistor sources in drains are formed by, for example, implantations into the silicon layer while transistor gates are formed by forming a patterned oxide and conductor (e.g. metal) layer structure. Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). However, the floating body can introduce dynamic instabilities in the operation of such a transistor.

Conventional SOI FET's have floating bodies in which the body or channel region of the FET is located on an insulator and not electrically connected to a fixed potential. These devices are known as partially depleted SOI devices and have the aforementioned advantages and disadvantages. Fully depleted SOI devices are those in which the layer of semiconductor is sufficiently thin, such that the entire thickness of the body regions is depleted of majority carriers when in the off state and both diffusions are at ground. Fully depleted devices offer additional advantages, such as reduced short channel effect, increased transconductance and reduced threshold voltage sensitivity to changes in body doping. Furthermore, the kink effects and threshold voltage shifts caused by body charging in partially depleted devices are reduced. The fully depleted devices do not have a neutral region in the channel and thus do no allow for charging and discharging of the body corresponding to he change in threshold voltage. Additionally, the fully depleted devices do no show hysterisis effect. Therefore, it is advantageous to be able to form a semiconductor wafer with both partially depleted and fully depleted devices based on the desired characteristics of the device for a given implementation.

SUMMARY OF THE INVENTION

The present invention provides a method for providing partially depleted and fully depleted transistor devices on the same semiconductor wafer. The present invention accomplishes this end by providing a bulk semiconductor wafer and etching at least one trench into the wafer. The wafer is then filled with an insulating material and polished down to the surface level of the semiconductor wafer to form a generally planar surface. A handle wafer is provided having a substrate layer and an insulating layer. The planar surface of the semiconductor wafer is bonded to the insulating layer of the handle wafer. The trench filled regions of the semiconductor wafer form regions of a first thickness and the remaining regions of the semiconductor wafer form regions of a second thickness. Fully depleted transistor device can then be formed in the regions of the first thickness and partially depleted transistor devices can be formed in regions of the second thickness.

One aspect of the invention relates to a method of forming an SOI MOSFET structure. The method comprises the steps of etching at least one trench in a semiconductive layer to form a semiconductive layer with a first thickness region and a second thickness region. The at least one trench is the filled with an insulator to form a generally planar top surface layer. A handle wafer is provided having a substrate layer and an insulating layer and the generally planar top surface layer is bonded to the insulating layer of the handle wafer.

Another aspect of the invention relates to an SOI MOSFET structure. The SOI MOSFET structure comprises a semiconductive layer having a top surface and a bottom surface and at least one trench in the top surface filled with insulator to form regions of the semiconductive layer of a first thickness and a second thickness. The SOI MOSFET structure further comprises a handle wafer having an insulating layer and a substrate layer. The top surface of the semiconductive layer is bonded to the insulating layer.

Yet another aspect of the invention relates to a method of forming fully depleted devices and partially depleted devices on the same semiconductor wafer. The method comprises the steps of etching at least one trench in a semiconductive layer to form a semiconductive layer with a first thickness region and a second thickness region. The second thickness region has a thickness greater than the first thickness region. The at least one trench is filled with an insulator to form a generally planar top surface layer. The insulator is polished down to the surface level of the semiconductive layer. The bottom surface of the semiconductive layer is reduced to a thickness suitable for a fully depleted device. A handle wafer is provided having a substrate layer and an insulating layer. The generally planar top surface layer is bonded to the insulating layer of the handle wafer.

To the accomplishment of the foregoing and related ends, the invention, then, comprises the features hereinafter fully described and particularly pointed out in the claims. The following description and the annexed drawings set forth in detail certain illustrative embodiments of the invention.

These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
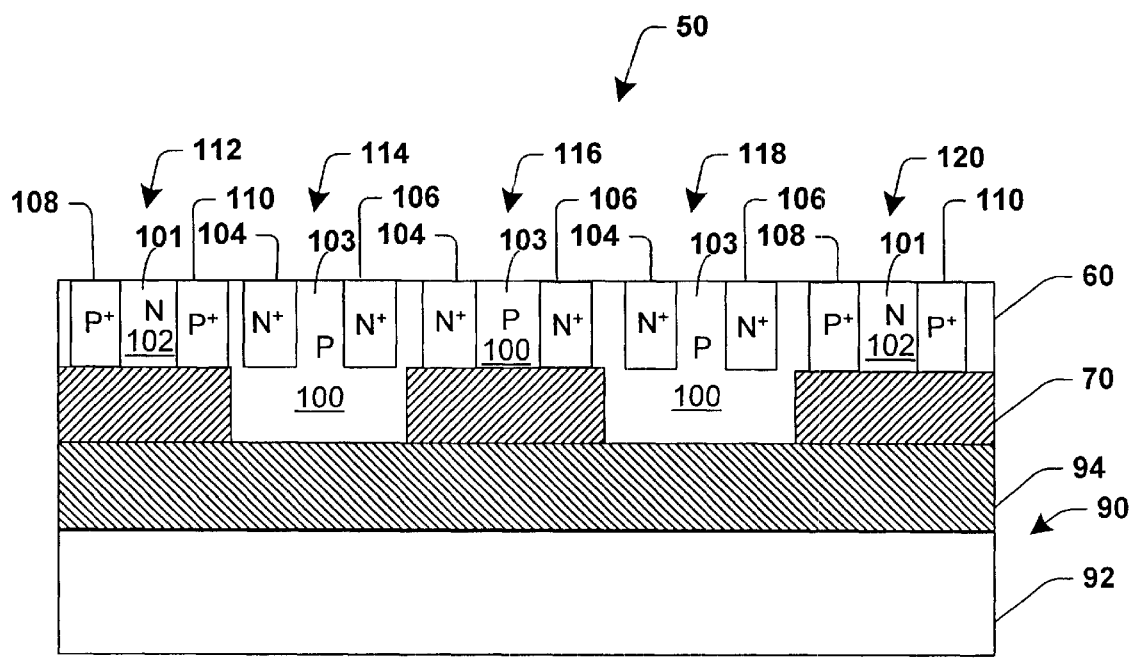
FIG. 1 is a schematic cross-sectional illustration of an SOI MOSFET structure in accordance with one aspect of the present invention.

The present invention relates to a MOSFET structure provided with both partially depleted and fully depleted devices on a single SOI structure. The MOSFET structure and the methodology of making the MOSFET structure of the present invention allows for implementing both partially depleted devices and fully depleted devices on a single SOI structure, so as to provided a device that can exhibit faster performance, lower power consumption and less device hysteresis than many conventional MOSFET devices. The present invention will now be described with reference to the drawings, wherein like reference numerals are used to refer to like elements throughout. It should be understood that the description of this preferred embodiment is merely illustrative and that it should not be taken in a limiting sense.

FIG. 1 is a schematic cross-sectional illustration of an SOI MOSFET structure 50 in accordance with the present invention. The device structure 50 includes a base 92 comprising silicon, for example. The base 92 provides mechanical support for the device structure 50, and is of a thickness suitable for providing such support. A dielectric layer 94 (e.g., $SiO_2$, $Si_3N_4$) is formed over the base 92. The thickness of the dielectric layer 94 is preferably within the range of 1000 Å to 5000 Å. The base 92 and the dielectric layer 94 form a bottom handle wafer 90. The bottom handle wafer 90 is bonded to a top layer 80. The top layer 80 includes a semiconductive layer 60 having regions of a first thickness for fully depleted devices and regions of a second thickness for partially depleted devices. A dielectric layer 70 is formed beneath the semiconductive layer 60. The semiconductive layer 60 becomes the active region for device fabrication.

The structure 50 includes a number of partially depleted and filly depleted devices. A filly depleted PMOS device 112 and a fully depleted PMOS device 120 are provided on the ends of the structure 50. Each PMOS device includes a $P^+$ source region 108, a $P^+$ drain region 110 and a N type body region 102. A fully depleted NMOS device 116 is provided in the center of the structure 50. A partially depleted NMOS device 114 and a partially depleted NMOS device 118 are provided on opposite sides of the fully depleted NMOS device 116. Each NMOS device includes a $N^+$ source region 104, a $N^+$ drain region 106 and a P type body region 100. It is to be appreciated that any number of partially depleted and fully depleted devices can be implemented onto the structure 50 only limited by the space of the structure. A channel region 101 is formed between the source region 108 and the drain region 110 of the PMOS devices 112 and 120, and a channel region 103 is formed between the source region 104 and the drain region 106 of the NMOS devices 114, 116 and 118. In a preferred aspect of the invention, the regions of a first thickness of the semiconductive layer 60 have a thickness of one-third the channel length of the fully depleted devices. For example, for a fully depleted device having a channel length of 100 nm, the silicon thickness would be 33 nm.

In one specific embodiment of the present invention, the source/drain regions for the NMOS devices include an arsenic or phosphorous implant having a dose concentration in the range of $1\times10^{18}$ to $1\times10^{20}$ atoms/cm$^2$ and implanted at an energy range of about 1 KeV to about 100 KeV and the source/drain regions for the PMOS devices include a boron implant having a dose concentration in the range of $1\times10^{18}$ to $1\times10^{20}$ atoms/cm$^2$ and implanted at an energy range of about 1 KeV to about 100 KeV. The p-type body 100 includes a P$^+$ implant (e.g., boron) having a dose within the range of $1\times10^{10}$ to $1\times10^{14}$ atoms/cm$^2$. The n-type body 102 includes an N$^+$ implant (e.g., arsenic, phosphorous) having a dose within the range of $1\times10^{10}$ to $1\times10^{14}$ atoms/cm$^2$.

Figure 2:
FIG. 2 is a schematic cross-sectional illustration of a semiconductive layer in accordance with one aspect of the present invention.

Turning now to FIGS. 2–18, fabrication steps in connection with forming the structure 50 of FIG. 1 are discussed. FIG. 2 illustrates a basic semiconductor silicon layer 60 in its early stages of fabrication. FIGS. 3–8 illustrate process steps associated with fabrication of the top layer 80 of the MOSFET device 50 (FIG. 1) in accordance with the present invention. The present process can employ shallow trench isolation (STI) techniques, which involves etching a trench into the semiconductor silicon layer 60 and filling the trench with an isolation material. Local oxidation of silicon (LOCOS) isolation processes generally occupy a great deal of wafer surface area, and thus STI provides for an alternative isolation technique.

Figure 3:
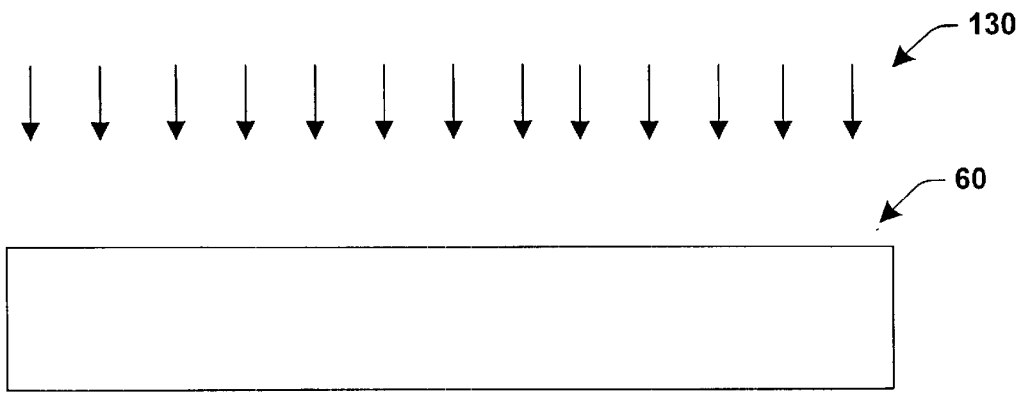
FIG. 3 is a schematic cross-sectional illustration of the semiconductive layer of FIG. 2 undergoing an etching step in accordance with one aspect of the present invention.
Figure 4:
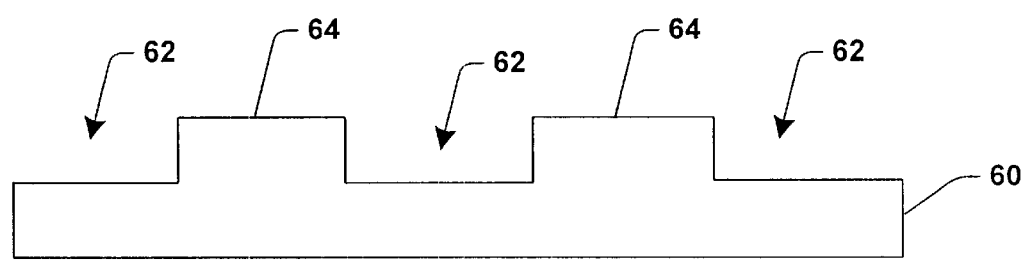
FIG. 4 is a schematic cross-sectional illustration of the structure of FIG. 3 with trench regions formed therein in accordance with one aspect of the present invention.
Figure 5:
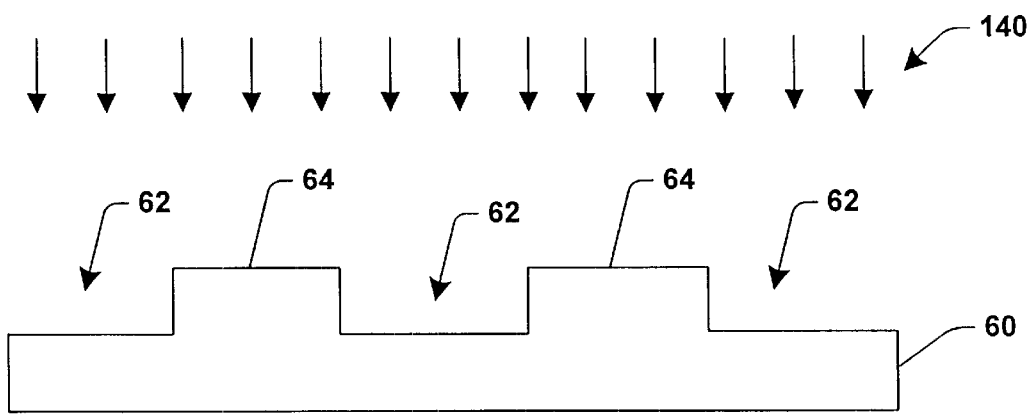
FIG. 5 is a schematic cross-sectional illustration of the structure of FIG. 4 undergoing an insulating layer fill in accordance with one aspect of the present invention.

FIG. 3 illustrates an etching step 130 of semiconductive layer 60. The silicon etch is performed so as to form thin silicon regions 62 and thick silicon regions 64 within the semiconductor silicon layer 60. In particular, a trench resist material (not shown) is applied to cover the structure and is then patterned to form a mask exposing the regions above the thin silicon regions 62. The thin silicon regions 62 are then etched into the top semiconductive layer 60 using suitable techniques. The trench resist material is thereafter stripped so as to result in the structure shown in FIG. 4.

Figure 6:
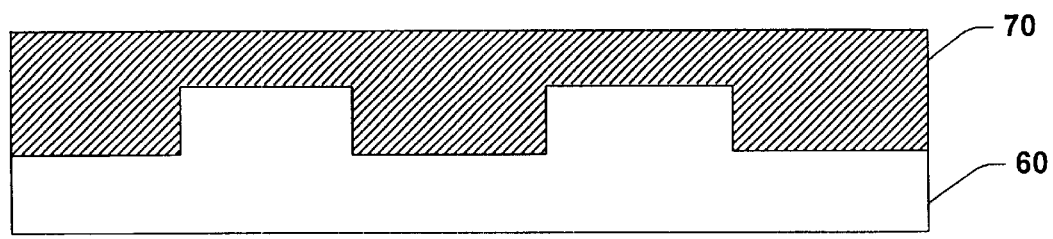
FIG. 6 is a schematic cross-sectional illustration of the structure of FIG. 5 with an insulating layer formed thereon so as to fill the trenches in accordance with one aspect of the present invention.
Figure 7:
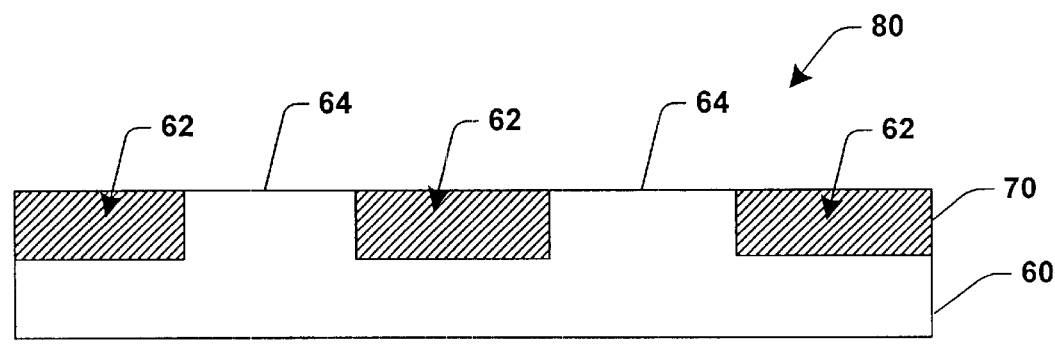
FIG. 7 is a schematic cross-sectional illustration of the structure of FIG. 6 after the insulating layer has been polished down to the surface of the semiconductive layer in accordance with the present invention.
Figure 8:
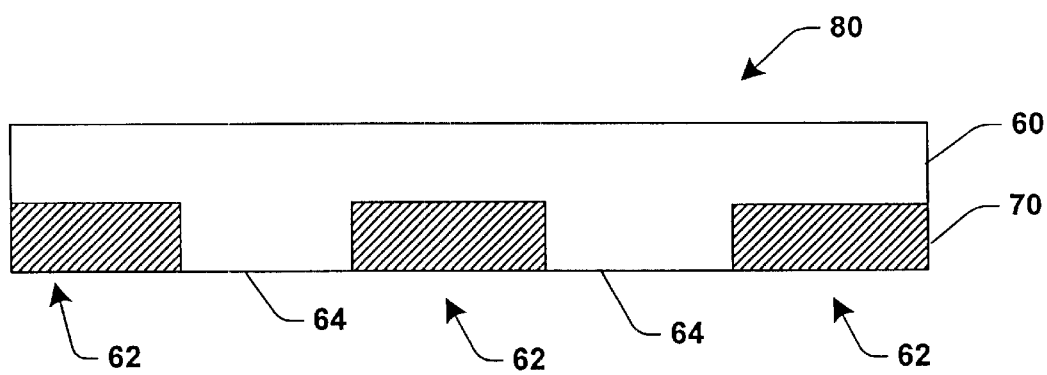
FIG. 8 is a schematic cross-sectional illustration of the structure of FIG. 7 after being turned over, ground and polished to an appropriate thickness in accordance with one aspect of the present invention.

Following the formation of the thin silicon regions or trenches 62 via the silicon etch, a layer of oxide material is formed on the structure using a high density plasma chemical vapor deposition (HDPCVD) step 140 (FIG. 5) in order to fill fully the trenches 62 with the oxide material 70 as shown in FIG. 6. As is known, HDPCVD is a self-planarizing process which facilitates reduction of the chemical mechanical polishing (CMP) times required in subsequent steps. (See, e.g., Pye, J. T. et al., High-density plasma CVD and CMP for 0.25-$\mu$m intermetal dielectric processing, Solid State Technology, Dec. 1995, pgs. 65–71). Following deposition of the oxide material 70, the oxide material 70 is polished via CMP down to the surface level of the semiconductive layer 60 to form a generally planar top surface as shown in FIG. 7. Consequently, the insulative oxide material 70 in the trenches 62 remains. The upper surface of the oxide material 70 is substantially even with the upper surface of the silicon layer 60 and form the top layer 80. The bottom surface of the top layer 80 is then ground and polished to the appropriate thickness for forming the fully depleted devices in the first regions and the partially depleted devices in the second regions. An alternative to grinding to achieve the appropriate thicknesses for the fully depleted devices in the first regions, is to implant hydrogen to achieve the appropriate thicknesses.

Figure 9:
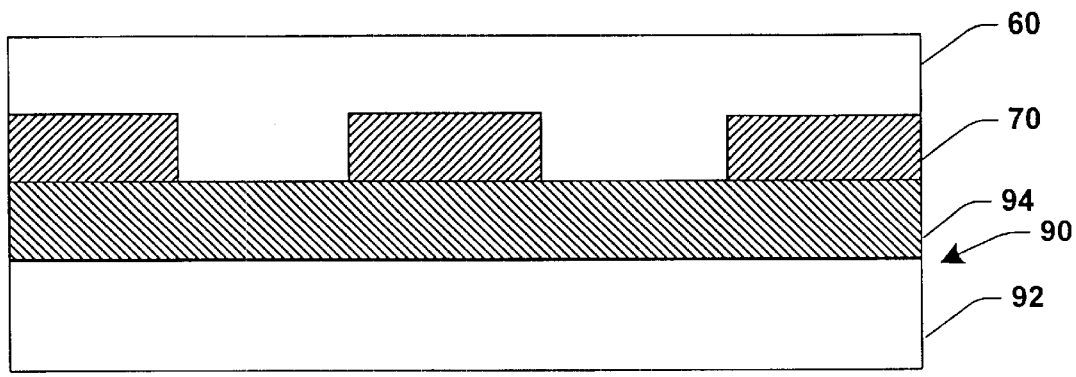
FIG. 9 is a schematic cross-sectional illustration of the structure of FIG. 8 bonded to a handle wafer in accordance with one aspect of the present invention.

The top layer 80 is then flipped (FIG. 8) and bonded to the bottom handle wafer 90 as illustrated in FIG. 9. Bonding can be accomplished by annealing the bottom handle wafer 90 to the top layer 80 in an oven at 400° C. The handle wafer includes the silicon base 90 and the oxide layer 92. The top surface of the top layer 80 is bonded to the oxide layer 92 of the handle wafer 90. This basic structure is formed preferably via a SIMOX (Separation by Implantation of Oxygen) process. The basic steps of the SIMOX process involve implanting oxygen beneath the surface of a silicon wafer. An annealing step is next performed to coalesce the implanted oxygen atoms into a uniform layer of SiO$_2$. The buried oxide layer 94 is typically 0.1 to 0.5 thick and exhibit almost complete incorporation of the implanted oxygen. Typical implant energies range from 150 to 200 keV, while the oxygen dose may vary from 1 to 2E18 cm$^{-2}$. Thus, the formation of the structure 50 is substantially complete in relevant part, except for the formation of the transistor devices.

Turning now to FIGS. 10–18, process steps in connection with completion of the MOSFET device 50 in accordance with the present invention are described. Although the present invention is described in the context of fabricating NMOS and PMOS type devices it is to be appreciated that the present invention has applicability to a variety of transistor devices. The present description will enable those skilled in the art to practice the invention with respect to a vast number of different types of transistor devices which are intended to fall within the scope of the invention as defined by the hereto appended claims.

Figure 10:
FIG. 10 is a schematic cross-sectional illustration of the structure of FIG. 9 undergoing an ion implant step to form p-type body regions in accordance with one aspect of the present invention.
Figure 10:
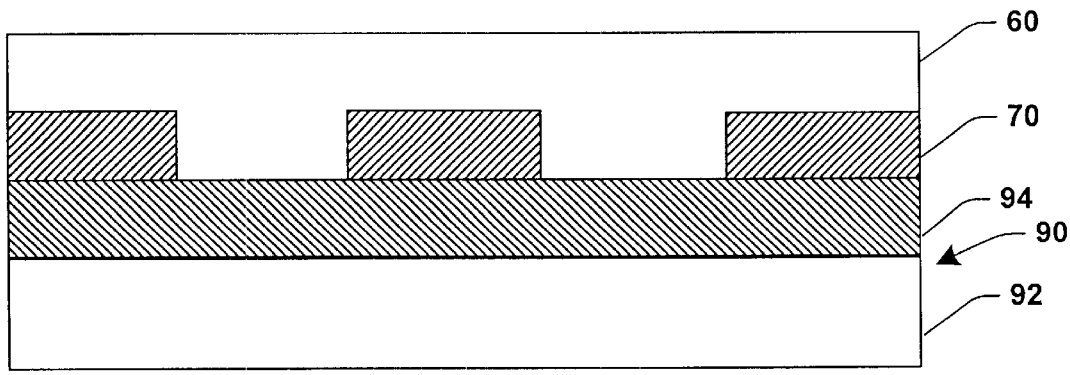
Figure 11:
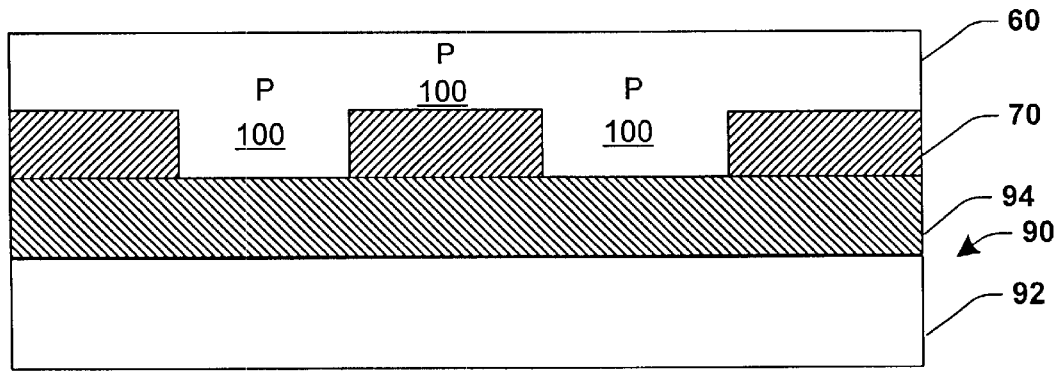
FIG. 11 is a schematic cross-sectional illustration of the structure of FIG. 10 after the ion implant to form p-type body regions in accordance with one aspect of the present invention.
Figure 12:
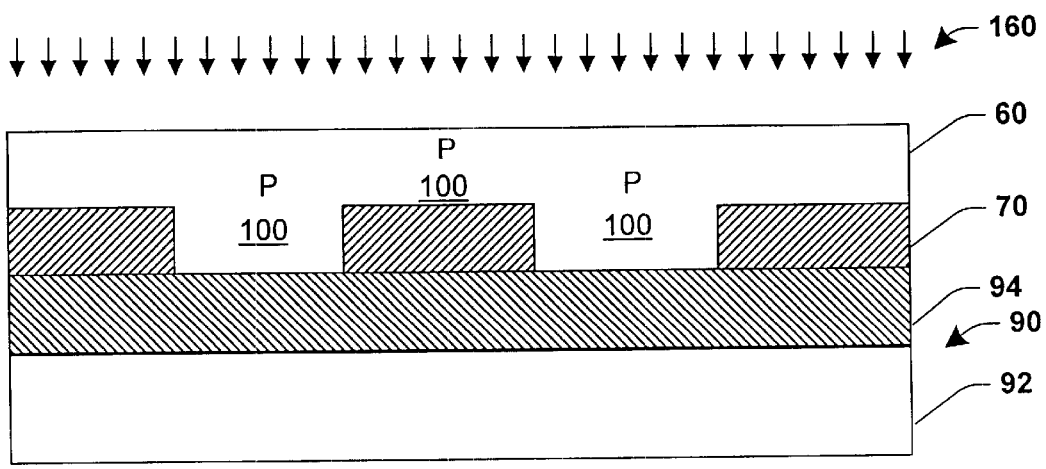
FIG. 12 is a schematic cross-sectional illustration of the structure of FIG. 11 undergoing an ion implant step to form n-type body regions in accordance with one aspect of the present invention.
Figure 13:
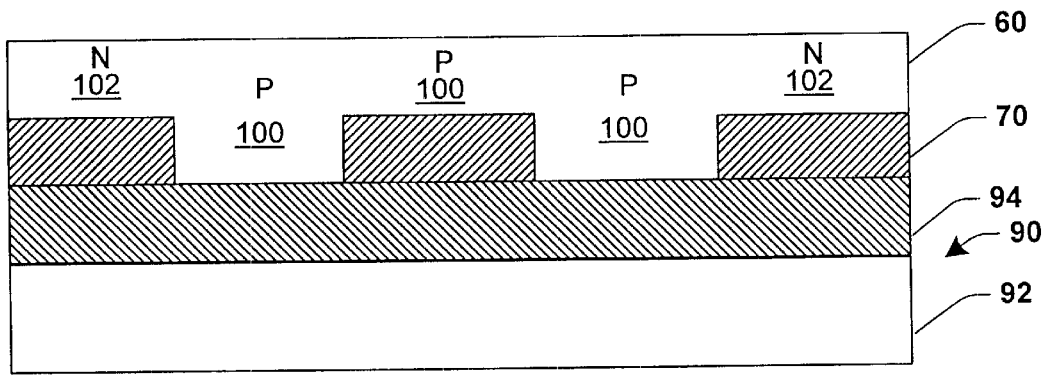
FIG. 13 is a schematic cross-sectional illustration of the structure of FIG. 12 after the ion implant to form n-type body regions in accordance with one aspect of the present invention.

FIG. 10 shows the formation of the p-type body regions 100 by masking a portion of the top silicon layer 60 with a photoresist layer (not shown) and implanting p-well dopants 150 to provide the p-type body regions 100 as illustrated in FIG. 11. Thereafter as shown in FIG. 12 the formation of the n-type body regions 102 by masking a portion of the top silicon layer 60 with a photoresist layer (not shown) and implanting n-well dopants 160 to provide the n-type body regions 102 as illustrated in FIG. 13.

Figure 14:
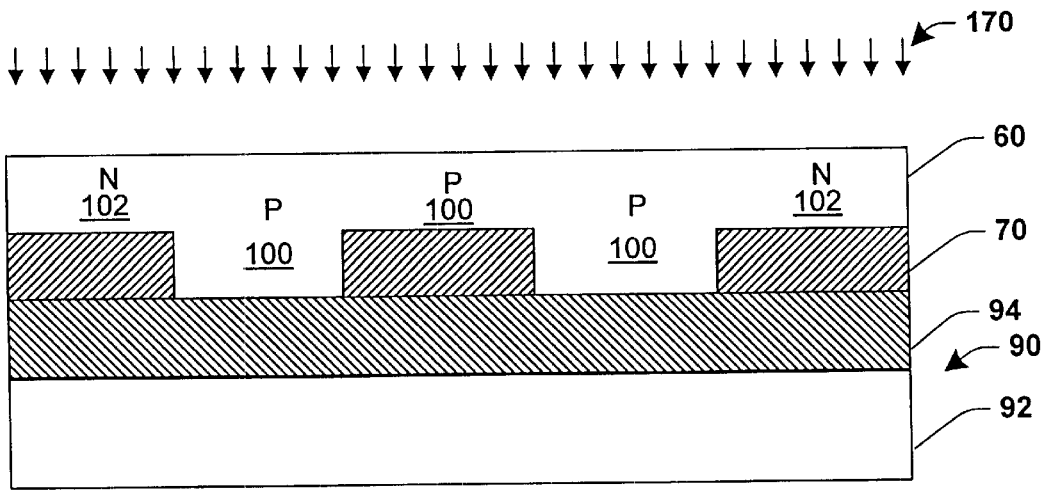
FIG. 14 is a schematic cross-sectional illustration of the structure of FIG. 13 undergoing an ion implant step to form $N^+$ source/drain (S/D) regions in accordance with one aspect of the present invention.
Figure 15:
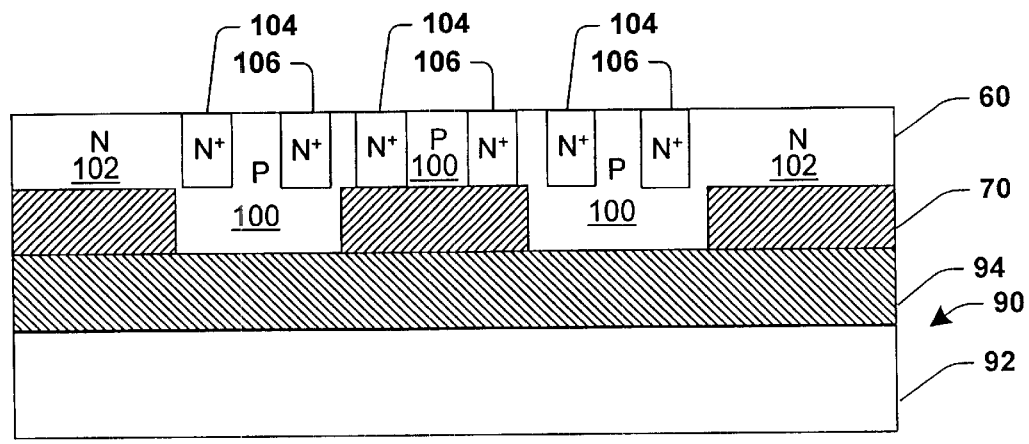
FIG. 15 is a schematic cross-sectional illustration of the structure of FIG. 14 after undergoing the ion implant step to form $N^+$ source/drain (S/D) regions in accordance with one aspect of the present invention.

FIG. 14 illustrates an n-region ion implant step. An N$^+$ implant 170 is used to form n-channel transistor source region 104 and drain region 106 (FIG. 15). In the preferred embodiment, this implant step may be an arsenic implant for example having a dose in the range of $1\times10^{18}$ to $1\times10^{20}$ atoms/cm$^2$ and an energy range of about 1 KeV to about 100 KeV. Arsenic is employed to make a substantially shallow junction because of its heavy nature and less tendency to move. Of course it will be appreciated that any suitable dose and energy range and implant may be employed to carry out the present invention. As the doping concentration of the source/drain regions is decreased, although the junction capacitance decreases, the resistivity of the source/drain regions increase which can cause the transistor to slow down. It is believed that between source/drain dopant concentrations of $10^{17}$/cm$^3$ and $10^{20}$/cm$^3$, however, that an optimal point exists where the low junction capacitance best compensates for the increased source/drain resistance.

Figure 16:
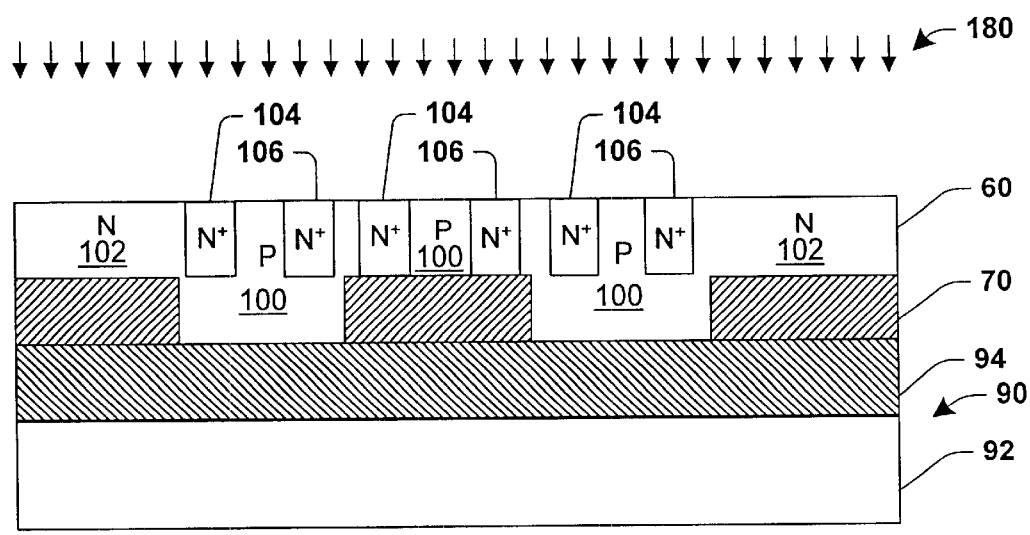
FIG. 16 is a schematic cross-sectional illustration of the structure of FIG. 15 undergoing an ion implant step to form $P^+$ source/drain (S/D) regions in accordance with one aspect of the present invention.
Figure 17:
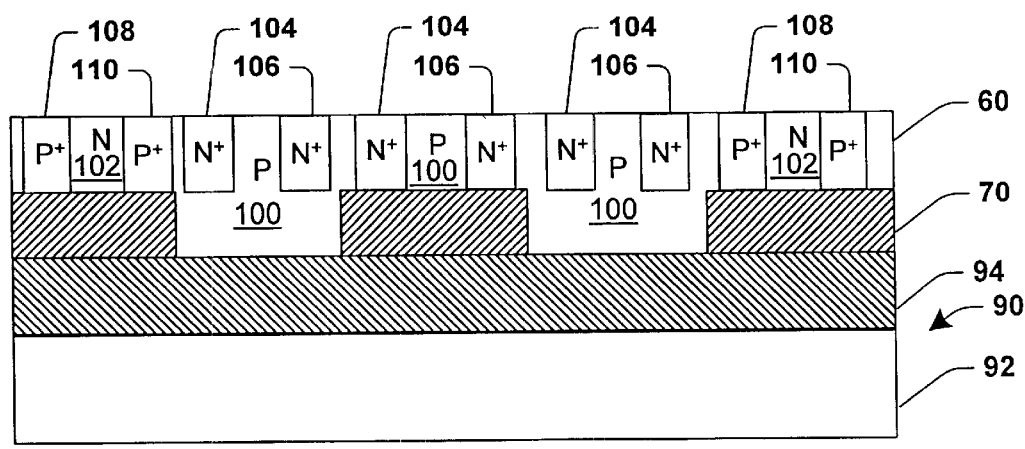
FIG. 17 is a schematic cross-sectional illustration of the structure of FIG. 16 after undergoing the ion implant step to form $P^+$ source/drain (S/D) regions in accordance with one aspect of the present invention.
Figure 18:
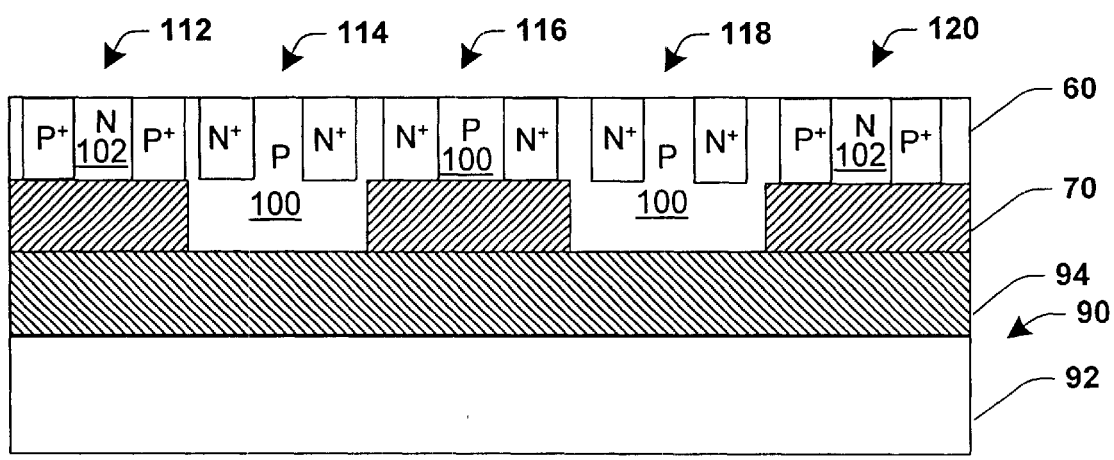
FIG. 18 is a schematic cross-sectional illustration of the structure of FIG. 17 having filly depleted and partially depleted devices in accordance with one aspect of the present invention.

FIG. 16 illustrates a p-region ion implant step. A P$^+$ implant 180 is used to form p-channel transistor source region 108 and drain region 110 (FIG. 17). In the preferred embodiment, this implant step may be a boron implant for example having a dose in the range of $1\times10^{18}$ to $1\times10^{20}$ atoms/cm$^2$ and an energy range of about 1 KeV to about 100 KeV. The structure 50 is substantially complete in relevant part as illustrated in FIG. 18. The structure 50 includes a fully depleted PNP transistor device 112, a fully depleted PNP transistor device 120 and a fully depleted NPN device 116. The structure 50 also includes a partially depleted NPN transistor devices 114 and 118. Any number of partially depleted and fully depleted devices can be provided on a single SOI structure by employing the present methodology.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming an SOI MOSFET structure comprising the steps of:

etching at least one trench in a semiconductive layer to form a semiconductive layer with a first thickness region and a second thickness region;

filling the at least one trench with an insulator to form a generally planar top surface layer;

providing a handle wafer having a substrate layer and an insulating layer;

bonding the generally planar top surface layer to the insulating layer of the handle wafer; and forming at least one filly depleted transistor device in the first thickness region and at least one partially depleted transistor device in the second thickness region.

2. The method of claim 1, the step of filling the at least one trench with an insulator further including the step of polishing the insulator to the surface level of the silicon substrate.

3. The method of claim 1, further including the step of reducing a bottom surface of the semiconductive layer to a thickness suitable for a fully depleted device.

4. The method of claim 3, the step of reducing a bottom surface of the semiconductive layer being accomplished by grinding the bottom surface of the semiconductive layer.

5. The method of claim 3, the step of reducing a bottom surface of the semiconductive layer being accomplished by implanting hydrogen into the surface of th semiconductive layer.

6. The method of claim 1, the step of bonding the generally planar top surface layer to the insulating layer of the handle wafer including annealing the bottom handle wafer to the generally planar top surface layer in an oven at 400° C.

7. The method of claim 1, the fully depleted device having a channel region with a channel length and the first thickness region having a general thickness of one-third the channel length.

8. The method of claim 1, the second thickness region being thicker than the first thickness region.

9. A method of forming fully depleted devices and partially depleted devices on the same semiconductor wafer, comprising the steps of:

etching at least one trench in a semiconductive layer to form a semiconductive layer with a first thickness region and a second thickness region, the second thickness region being greater than the first thickness region;

filling the at least one trench with an insulator to form a generally planar top surface layer;

polishing the insulator to the surface level of the semiconductive layer;

reducing a bottom surface of the semiconductive layer to a thickness suitable for a fully depleted device;

providing a handle wafer having a substrate layer and an insulating layer; and bonding the generally planar top surface layer to the insulating layer of the handle wafer;

forming at least one fully depleted transistor device in the first thickness region and at least one partially depleted transistor device in the second thickness region.

10. The method of claim 9, the step of reducing a bottom surface of the semiconductive layer being accomplished by grinding the bottom surface of the semiconductive layer.

11. The method of claim 9, the step of reducing a bottom surface of the semiconductive layer being accomplished by implanting hydrogen into the surface of the semiconductive layer.

12. The method of claim 9, the step of bonding the generally planar top surface layer to the insulating layer of the handle wafer including annealing the bottom handle wafer to the generally planar top surface layer in an oven at 400° C.

13. The method of claim 9, the fully depleted device having a channel region with a channel length and the first thickness region having a general thickness of one-third the channel length.

14. The method of claim 9, further including the step of polishing the bottom layer after the step of reducing.

* * * * *